(12) United States Patent
Ito et al.

(10) Patent No.: US 6,709,531 B2
(45) Date of Patent: Mar. 23, 2004

(54) CHEMICAL LIQUID PROCESSING APPARATUS FOR PROCESSING A SUBSTRATE AND THE METHOD THEREOF

(75) Inventors: Shinichi Ito, Kanagawa-ken (JP); Riichiro Takahashi, Kanagawa-ken (JP); Tatsuhiko Ema, Kanagawa-ken (JP); Katsuya Okamura, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/396,407

(22) Filed: Mar. 26, 2003

(65) Prior Publication Data

US 2003/0159719 A1 Aug. 28, 2003

Related U.S. Application Data

(62) Division of application No. 09/784,200, filed on Feb. 16, 2001, now Pat. No. 6,579,382.

(30) Foreign Application Priority Data

Feb. 17, 2000 (JP) ........................................ P2000-39683
Sep. 28, 2000 (JP) ...................................... P2000-297441

(51) Int. Cl.⁷ ................................................ B08B 5/04
(52) U.S. Cl. ............................ 134/21; 134/33; 134/37; 134/402; 134/17; 438/745; 438/747; 438/748; 438/906; 15/300.1; 15/302; 15/303; 15/365; 427/240; 427/425
(58) Field of Search .............................. 134/33, 21, 37, 134/902, 17; 438/745, 747, 748, 906; 15/300.1, 302, 303, 345; 427/240, 425

(56) References Cited

U.S. PATENT DOCUMENTS

| | | | |
|---|---|---|---|
| 6,006,763 A | 12/1999 | Mori et al. | |
| 6,265,323 B1 | 7/2001 | Nakamura et al. | |
| 6,372,413 B2 * | 4/2002 | Ema et al. | 430/326 |
| 6,528,128 B2 | 3/2003 | Ito et al. | |
| 6,550,990 B2 * | 4/2003 | Sakurai et al. | 396/604 |
| 6,579,382 B2 * | 6/2003 | Ito | 134/33 |

FOREIGN PATENT DOCUMENTS

| | | |
|---|---|---|
| JP | 10-172951 | 6/1998 |
| JP | 11-260718 | 9/1999 |
| JP | 11-307433 | 11/1999 |
| JP | 11-329960 | 11/1999 |
| JP | 2000-147787 | 5/2000 |
| TW | 357406 | 5/1999 |

* cited by examiner

*Primary Examiner*—Randy Gulakowski
*Assistant Examiner*—M. Kornakov
(74) *Attorney, Agent, or Firm*—Finnegan, Henderson, Farabow, Garrett & Dunner, L.L.P.

(57) ABSTRACT

In this disclosure, air flow is formed above chemical liquid film and a move of the chemical liquid is generated by making the air flow into a contact with the surface of chemical liquid. Further, a negative pressure is generated in a space between a processing object substrate and a plate by rotating the plate. Consequently, uniformity of processing of chemical liquid is improved, so that liquid removing step can be carried out effectively. As a result, yield rate of chemical liquid treatment can be improved.

11 Claims, 18 Drawing Sheets

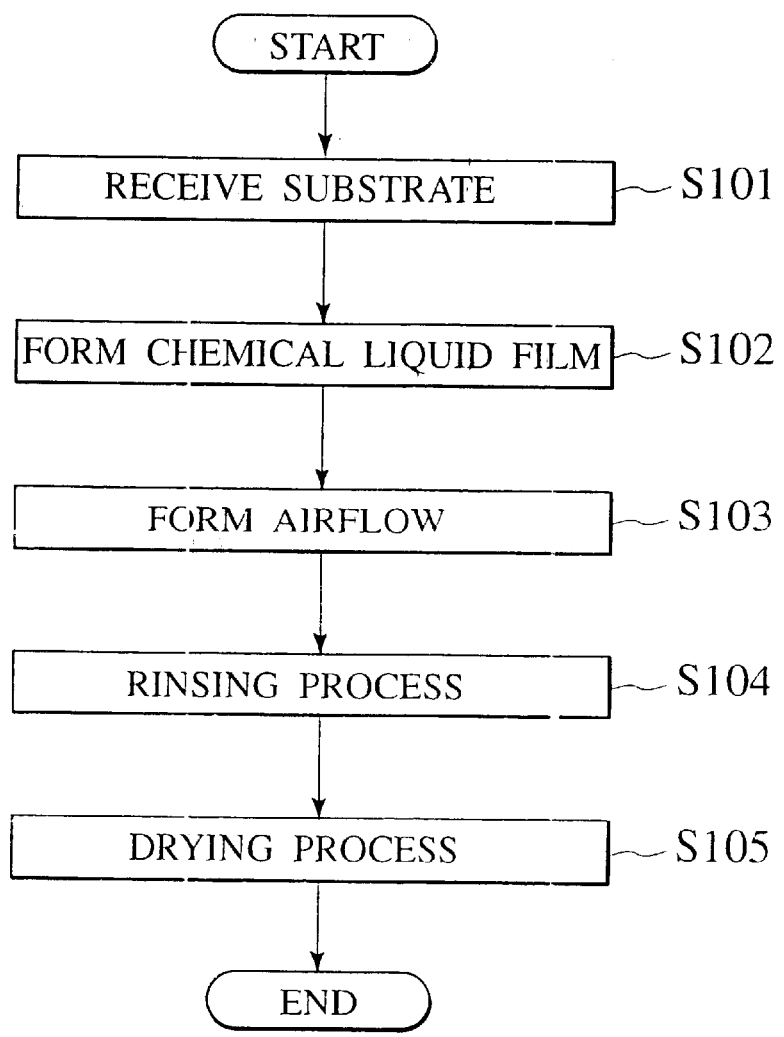

CHEMICAL LIQUID PROCESSING APPARATUS FOR PROCESSING A SUBSTRATE AND THE METHOD THEREOF

This is a division of application Ser. No. 09/784,200, filed Feb. 16, 2001, now U.S. Pat. No. 6,579,382 which is incorporated herein by reference.

CROSS REFERENCE TO RELATED APPLICATIONS

The subject application is related to subject matter disclosed in the Japanese Patent Applications No.Tokugan2000-039683 filed in Feb. 17, 2000, and No.Tokugan2000-297441 filed in Sep. 28, 2000 in Japan, to which the subject application claims priority under the Paris Convention and which is incorporated by reference herein.

BACKGROUND OF THE INVENTION

1. Field of the Invention

The present invention relates to a chemical liquid processing apparatus for processing a substrate using chemical liquid and a chemical liquid processing method therewith and more particularly to technology for processing various types of substrates such as a semiconductor substrate in semiconductor device manufacturing process, reticle (photo mask) in lithographic process which is one step of semiconductor device manufacturing process, and flat panel in liquid crystal display manufacturing process.

2. Description of the Related Art

Generally, chemical liquid processing for processing various types of substrates using chemical liquid is carried out by performing chemical liquid film forming step for forming chemical liquid by puddling on a processing object substrate, on which a processing object film is formed, so as to process the processing object film into a desired configuration, and liquid removing (cleaning/drying) step for cleaning and drying the processing object substrate on which the chemical liquid is applied, repeatedly. Meanwhile, the chemical liquid processing step mentioned here includes, for example, development processing in photo-lithographic step of semiconductor manufacturing process, wet etching processing to be carried out after photo-lithographic step and the like.

By the way, the aforementioned chemical liquid film forming step and liquid removing (cleaning/drying) step have following technical problems which should be solved.

First, technical problems in the chemical liquid film forming step will be described.

The chemical liquid film forming step for etching the processing object film by coating and settling the chemical liquid on the processing object substrate, on which the processing object film is formed, has such a problem that supply of new etchant to an etching region is not accelerated because etching product remains on the etching region and the surrounding of the etching region. As a result of this problem, etching velocity around the etching region is reduced. This problem is particularly conspicuous around the etching region near a broader etching region.

To solve this problem, some applications were proposed up to now. For example, Japanese Patent Application Laid-Open No. H11-329960 has disclosed a technology of moving chemical liquid on the processing object film at the time of etching. According to this document, a predetermined sheet material is brought into contact with the surface of chemical liquid on the processing object film and by moving that sheet material, the chemical liquid is moved on the processing object film. By moving the chemical liquid on the processing object film, a flow is generated in the chemical liquid so that the chemical liquid is agitated. As a result, new etchant is supplied to the etching region, thereby making it possible to suppress reduction of the etching velocity in the etching region near a broader etching region.

However, if such technology is employed, after the chemical liquid is agitated, the sheet material needs to be washed and when washing the sheet material, dust and dirt adhering to the sheet material adhere to the surface of the processing object substrate, so that a defect may occur on the processing object substrate.

On the other hand, according to other proposal, the chemical liquid is moved on the processing object film by rotating the processing object substrate intermittently (see Japanese Patent Application Laid-Open No. H11-307433). According to this technology, the processing object substrate is held by the substrate holding portion and by repeating a rotation and a static condition of the processing object substrate, the chemical liquid is moved.

However, as a result of investigation of this technology by inventors of the present invention, when the processing object substrate was rotated, the chemical liquid was not moved but rotated together with the processing object substrate because of its viscosity. And, when the rotation of the processing object substrate was stopped, the chemical liquid only trembles slightly due to its inertial force. Therefore, even if this technology is employed, the reduction of etching velocity in the etching region near a broader etching region must be difficult to suppress sufficiently.

As described above, the conventional chemical liquid film forming step cannot suppress the reduction of etching velocity in the etching region without generation of defects or additional work. Thus, the yield rate of the entire chemical liquid processing cannot be improved.

Next, technical problem of liquid removing (cleaning/drying) step will be described.

In a conventional liquid removing (cleaning/drying) step, cleaning chemical liquid on the substrate is blown out and removed by rotating the substrate at high speeds.

However, when the liquid removing (cleaning/drying) step is carried out by this method, the quantity of defects induced by microscopic dust generated from abrasion between a chuck for fixing the substrate and a rear face of the substrate is increased with decrease of pattern dimension and increase of rotation speed. Further, because of increases of aspect ratio of resist pattern and diameter of the substrate with micro-fabricated resist pattern in recent years, influences by water flow and centrifugal force generated at high speed rotation increase, so that pattern fall is more likely to occur. Thus, in the conventional, liquid removing (cleaning/drying) step, the yield rate of the entire chemical liquid processing cannot be improved like the chemical liquid film forming step.

As described above, the conventional chemical liquid processing apparatus and chemical liquid processing method have technical problems which should be solved early in both the chemical liquid film forming step and liquid removing (cleaning/drying) step. Thus, it is difficult to improve the yield rate of the entire chemical liquid processing.

SUMMARY OF THE INVENTION

The present invention has been achieved to solve the above described technical problems and its object is to provide a chemical liquid processing apparatus capable of improving the yield rate of chemical liquid processing.

Another object of the present invention is to provide a chemical liquid processing method capable of improving the yield rate of the chemical liquid processing.

According to a first feature of the chemical liquid processing apparatus and the chemical liquid processing method, there are included at least the steps of: supplying chemical liquid for processing a processing object film to a processing object substrate, on which the processing object film is formed, so as to form chemical liquid film on the processing object substrate; and after the step for forming the chemical liquid film, forming air flow such that it makes a contact with the chemical liquid film so as to hold the chemical liquid film on the processing object substrate and form a flow of the chemical liquid on the surface of the chemical liquid film.

According to this chemical liquid processing apparatus and chemical liquid processing method, the chemical liquid is moved by forming airflow above the chemical liquid film and making the air flow into contact with the surface of the chemical liquid. By this procedure, the chemical liquid is agitated, thereby improving uniformity of processing the processing object film by the chemical liquid. In the present invention, the steps of forming chemical liquid film on the processing object substrate and forming the flow of chemical liquid on the chemical liquid film is defined as chemical liquid film forming/agitating process.

Further, the second feature of the chemical liquid processing apparatus and chemical liquid processing method according to the present invention is that, a process for removing liquid supplied beforehand to a substrate comprising the steps of: holding said substrate; rotating a plate having an air intake hole above said substrate; generating a negative pressure between the plate and a processing object substrate by rotating said plate; and generating air flow between said processing object substrate and said plate by sucking air through said air intake hole in the presence of the negative pressure.

According to this chemical liquid processing apparatus and chemical liquid processing method, the liquid on the substrate can be removed without rotating the substrate. And further, the occurrence of fall of resist pattern, which occur from the effect of a centrifugal force and water flow generated in the case of removing liquid by rotating a substrate, can be reduced. Further more, by not-rotating the substrate, generation of dust from the rear face due to abrasion between the substrate and the chuck could be prevented.

Further, according to a third feature of the chemical liquid processing apparatus and the chemical liquid processing method, there are included the steps of: supplying chemical liquid for processing a processing object film to a processing object substrate on which said processing object film is formed so as to form chemical liquid film on said processing object substrate; after the step for forming the chemical liquid film, forming air flow which contacts with the chemical liquid film so as to hold said chemical liquid film on said processing object substrate and form a flow of the chemical liquid on the surface of said chemical liquid film using a plate disposed above said processing object substrate and having an air intake hole with the valve at the center; and removing said chemical liquid supplied to a substrate, wherein the step for removing said chemical liquid supplied to a substrate further comprises the steps of: generating a negative pressure between the plate and said processing object substrate by rotating said plate; and generating air flow between said processing object substrate and said plate by sucking air through said air intake hole in the presence of the negative pressure.

According to this chemical liquid processing apparatus and chemical liquid processing method, by performing the successive process of agitating the chemical liquid film on the processing object substrate, rinsing the processing object substrate surface and removing the chemical liquid film using the plate, it is possible to (1) improve the uniformity of the processing the processing object substrate by chemical liquid, (2) reduce the occurrence of fall of resist pattern, which occur from the effect of a cetrifugal force and water flow generated in the case of removing liquid by rotating a substrate, and (3) prevent the generation of dust from the rear face due to abrasion between the substrate and the chuck. As a result, the yield rate of the entire chemical liquid processing can be improved.

Other and further objects and features of the present invention will become obvious upon understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 1 is a flow chart showing a chemical liquid processing method according to the embodiment of the present invention;

DETAILED DESCRIPTION OF THE PREFERRED EMBODIMENTS

Figure 2A:
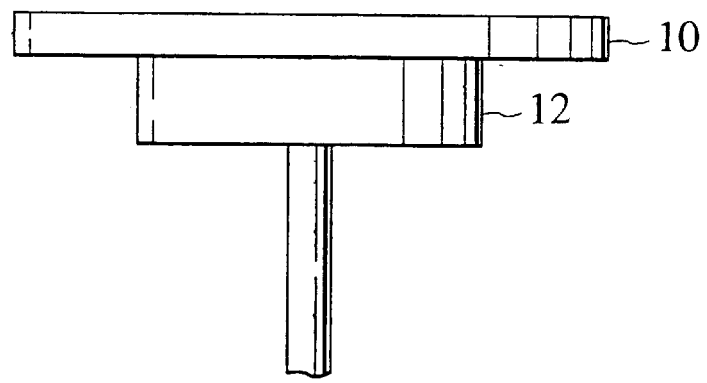
FIG. 2 is a schematic diagram for explaining a chemical liquid film forming step according to the embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

The chemical liquid film forming/agitating process and liquid removing (cleaning/drying) process according to the embodiment of the present invention is explained below with reference to FIG. 1–FIG. 21.

Chemical Liquid Film Forming/Agitating Process

First, the chemical liquid film forming/agitating process according to the embodiment of the present invention is described.

First Embodiment

First, chemical liquid processing method according to the first embodiment of the present invention is explained with reference to FIGS. 1–4.

(1) First, as shown in FIG. 2A, the processing object substrate 10 which preparing step is finished is carried to the top of the substrate holding portion 12 by means of a transportation robot (not shown). And, the processing object substrate 10 is left from the transportation robot and received by the substrate holding portion 12. The processing object substrate 10 is fixed to the substrate holding portion 12 by sucking (S101).

Figure 2B:
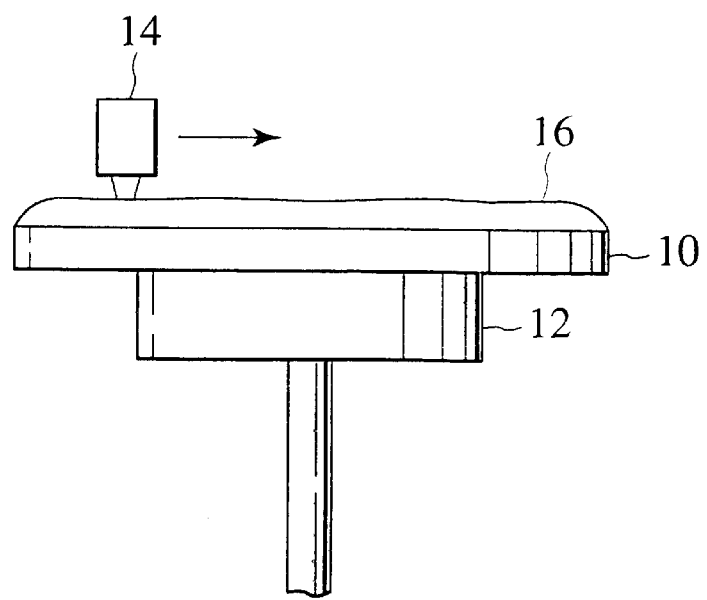

(2) Next, as shown in FIG. 2B, chemical liquid 16 for processing a processing object film on the processing object substrate 10 is formed on the processing object substrate 10. Chemical liquid 16 is supplied from, for example, the chemical spouting nozzle 14 disposed above the processing object substrate 10. The chemical spouting nozzle 14 scans the processing object substrate 10 from an end of the processing object substrate 10 to the other end thereof while supplying the chemical liquid 16. Consequently, the chemical liquid film 16 is formed on the processing object substrate 10 (S102).

Figure 3A:
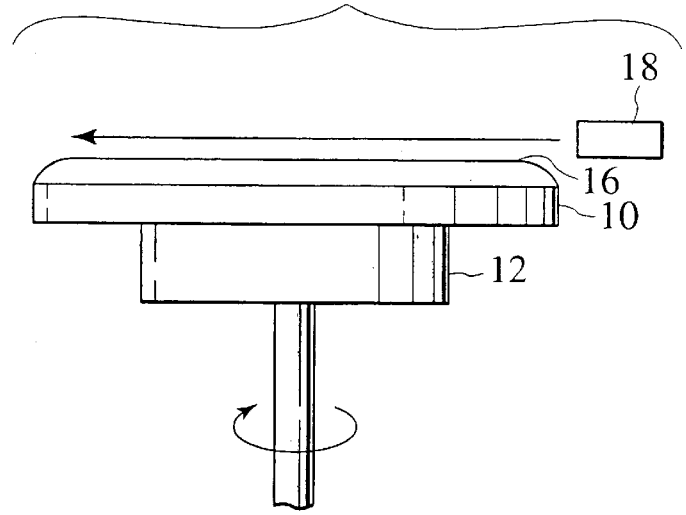
FIG. 3 is a schematic diagram for explaining a chemical liquid film forming step according to the embodiment of the present invention.

(3) Next, as shown in FIG. 3A, gas is supplied from the gas supply portion 18 disposed near the outer periphery of the processing object substrate 10 so as to form air flow above the chemical film 16 formed on the processing object substrate 10. It is effective to rotate the processing object substrate 10 when the air flow is formed by rotation of the substrate holding portion 12. In this case, it is desirable for the rotation direction of the processing object substrate 10 to coincide with the direction of the air flow (S103).

Figure 3B:
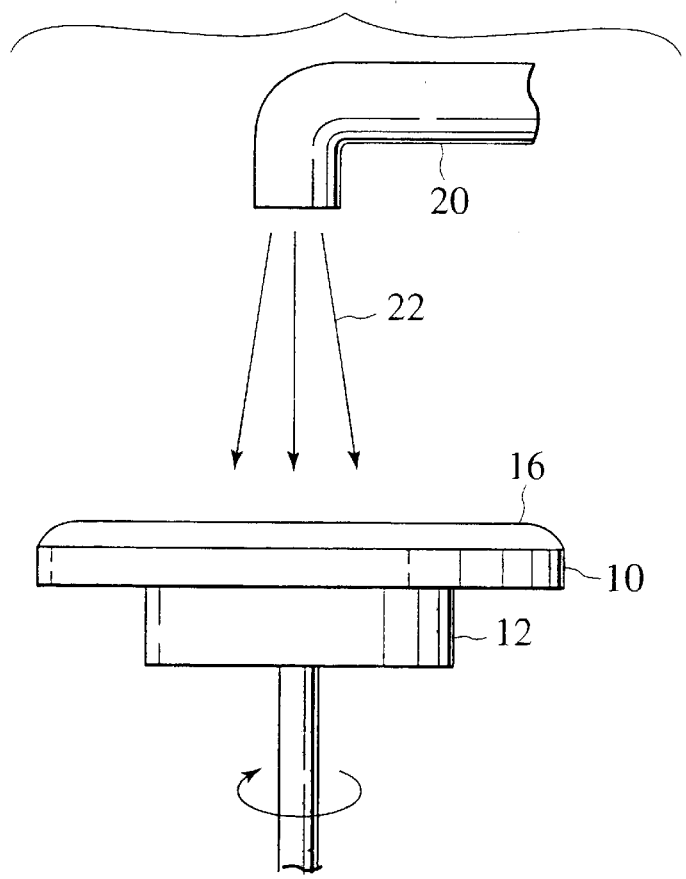

(4) Next, as shown in FIG. 3B, rinse liquid (e.g., pure water) 22 is supplied from the rinse liquid supply port 20 disposed above the processing object substrate 10 and the processing object substrate 10 is cleaned while rotating it (S104).

Figure 4:
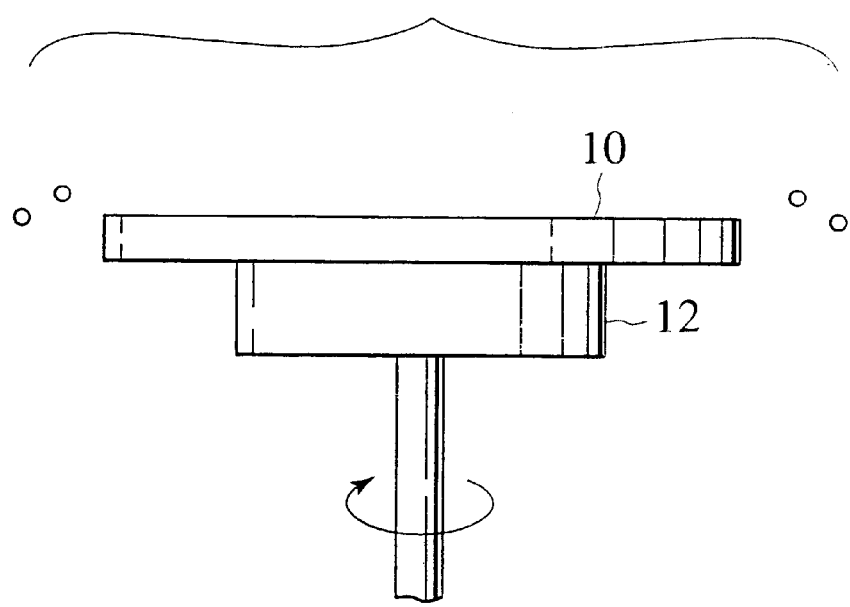
FIG. 4 is a schematic diagram for explaining a chemical liquid film forming step according to the embodiment of the present invention.

(5) Finally, as shown in FIG. 4, rinse liquid 22 on the processing object substrate 10 is blown out by rotating the processing object substrate at high speeds and the substrate 10 is dried (S105).

Figure 5A:
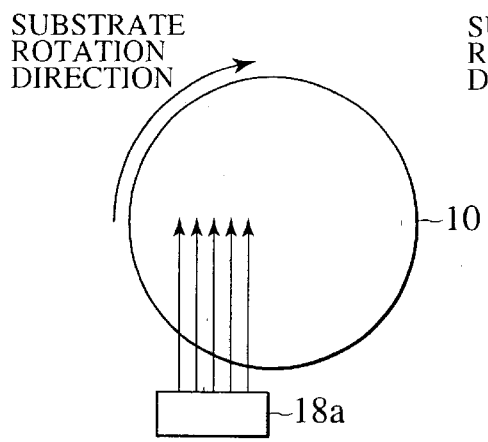
FIG. 5 is a schematic diagram showing a structure of a gas supply portion according to the embodiment of the present invention.
Figure 5B:
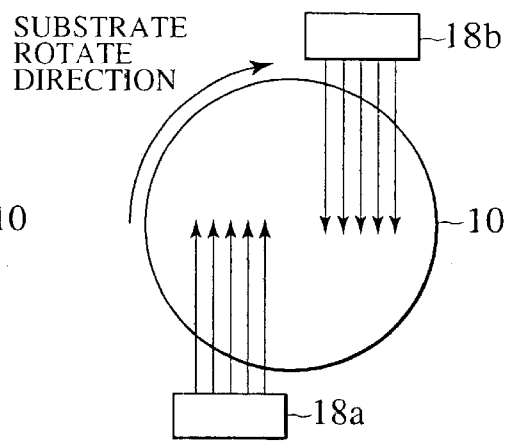
Figure 5C:
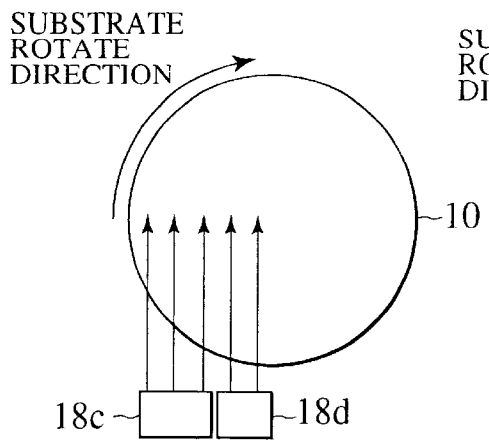
Figure 5D:
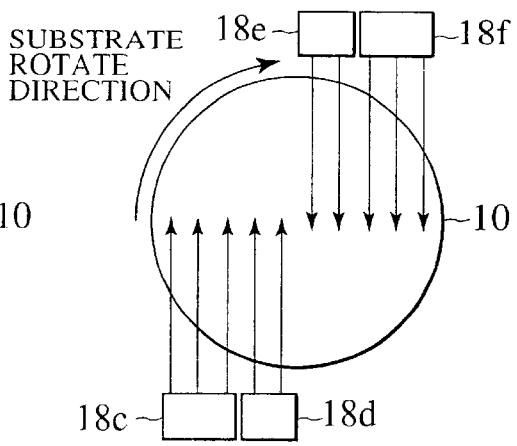

In the first embodiment of the present invention, the gas supply portion 18 is desired to be disposed as follows. FIG. 5 shows the disposition of the gas supply portion 18. FIG. 5A shows the example which a gas supply portion 18a is disposed near the outer periphery of the processing object substrate 10. The directions of air flows coincide with a substrate rotation direction. FIG. 5B shows the example which two gas supply portions 18a, 18b are disposed near the outer periphery of the processing object substrate 10 such that they oppose each other. The both directions of air flows in the gas supply portions 18a, 18b coincide with a substrate rotation direction. FIG. 5C shows the example which two gas supply portions 18c, 18d is disposed in parallel near the outer periphery of the processing object substrate 10. Here, the gas supply portion 18c pear the outer periphery (outer circle range) of the processing object substrate 10 ensures a faster gas flow than the gas supply portion 18d near the center (inner circle range) of the processing object substrate 10. The directions of gas flows from the gas supply portion 18c, 18d coincide with the rotation direction of the substrate. FIG. 5D shows the example which two gas supply portions 18c, 18d is disposed near the outer periphery of the processing object substrate 10 while disposing gas supply portions 18e, 18f in parallel so as to oppose the gas supply portions 18c, 18d. Here, the gas supply portions 18c, 18f near the outer periphery of the processing object substrate 10 ensure a faster gas flow than the gas supply portions 18d, 18e near the center of the processing object substrate 10. The directions of gas flows from the gas supply portions 18c, 18d, 18e, 18f coincide with the rotation direction of the substrate.

Figure 6A:
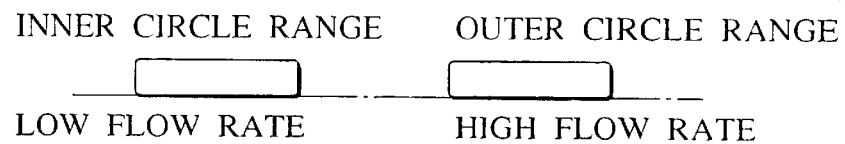
FIG. 6 is a schematic diagram showing a structure of a gas supply port of the gas supply portion according to the embodiment of the present invention.
Figure 6B:
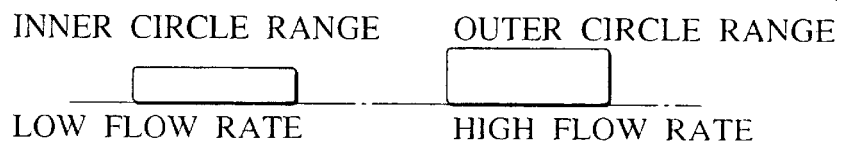
Figure 6C:
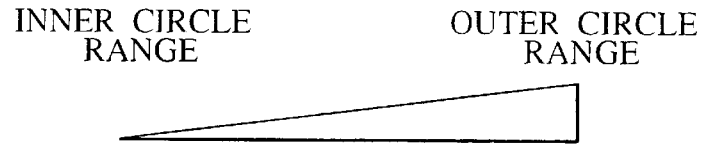

The gas supply port of the gas supply portion 18 can have structures as follows. FIG. 6 shows the cross section of the gas supply port. FIGS. 6A, 6B, 6C shows the flat port structure with a constant flow rate in both the inner circle and outer circle ranges, the flat port structure ensures a low flow rate in the inner circle range while ensuring a higher flow rate in the outer circle range, and a structure which a port width is small in the inner circle range while it increases as it goes to the outer periphery range can be considered, respectively.

Figure 7A:
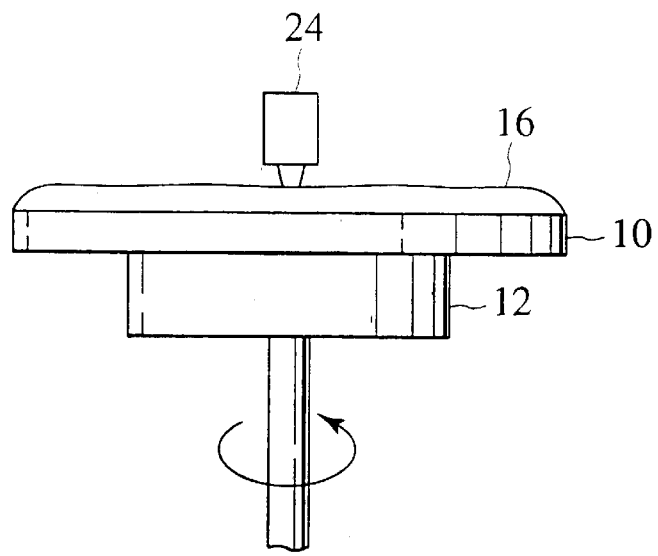
FIG. 7 is a schematic diagram showing a structure of a chemical spouting nozzle according to other embodiment of the present invention.
Figure 7B:
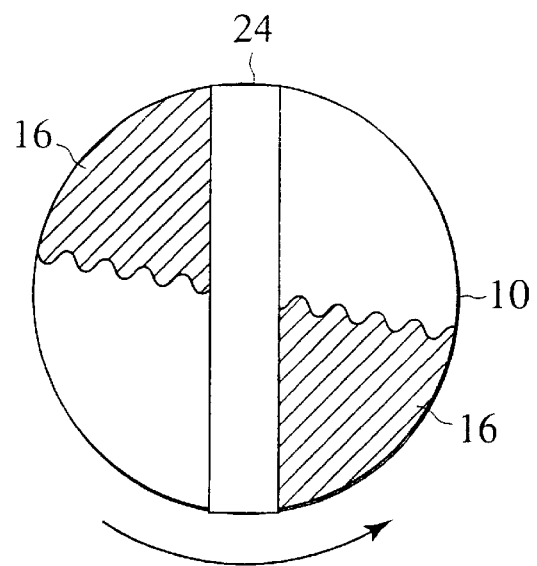
Figure 8A:
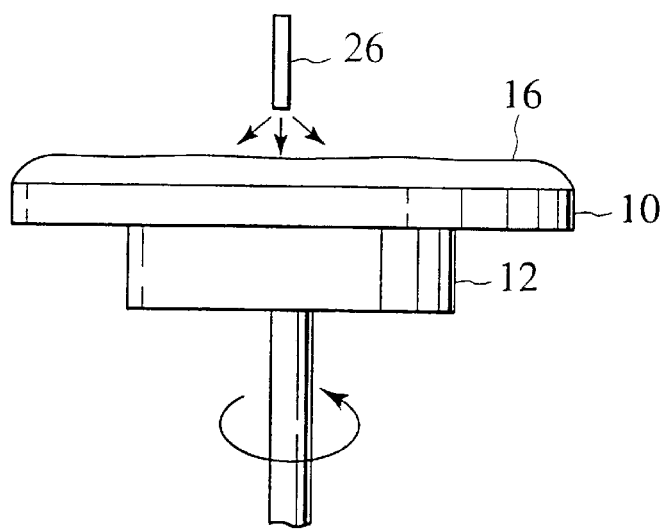
FIG. 8 is a schematic diagram showing a structure of a chemical spouting nozzle according to other embodiment of the present invention.
Figure 8B:
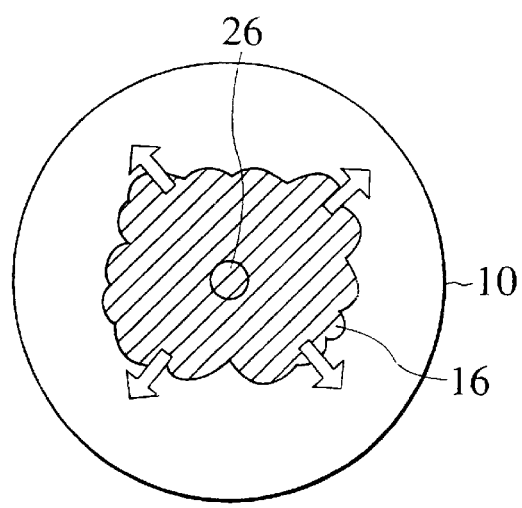

In the above described embodiment, the supply of the chemical liquid 16 is not restricted to by scanning the chemical spouting nozzle 14 from one end to the other end and it is permissible to use the nozzle as follows. FIG. 7 shows a bar-like nozzle and FIGS. 7A, 7B is a cross section and a plane figure when supplying the chemical liquid, respectively. And, FIG. 8 shows a straight nozzle and FIGS. 8A, 8B is a cross section and a plane figure when supplying the chemical liquid, respectively.

Next, the chemical liquid processing method according to the first embodiment of the present invention is explained with the result of the experiment performed by the inventors.

First, reflection preventing film of 6 nm and resist film of 400 nm were formed successively on a semiconductor substrate 10, which was the processing object substrate. Then, after a latent image was formed on a resist film using an exposure device, baking was carried out at 130° for 60 seconds.

Next, developing solution 16, which was the chemical liquid, was supplied to the top of a semiconductor substrate 10 so as to form the film of the developing solution 16 by puddling on the semiconductor substrate 10. Then, nitrogen gas was supplied to the top of the semiconductor substrate 10 so as to form a flow of nitrogen gas such that it contacts the surface of the developing solution film 16. The flow rate of the nitrogen gas was adjusted to 150 to 400 mm/sec on the surface of the developing solution film 16 and at the same time, other adjustment was made for the developing solution 16 not to flow out of and to a rear face of the semiconductor substrate 10. Further, the gas supply portion 18 was disposed as shown in FIG. 5D and the flow rate of nitrogen gas was set to be quicker on the outer circle range than the inner circle range. Further, when supplying nitrogen gas, the semiconductor substrate 10 was rotated and the rotation direction was made to coincide with the direction of gas flow. At this time, the rotation speed of the semiconductor substrate 10 was 5 rpm and the surface rotation speed of the developing solution 16 was 35 rpm. That is, the surface rotation speed (relative rotation speed) of the developing solution film 16 relative to the rotation speed of the semiconductor substrate 10 was 30 rpm.

Here, I-beam resist film was formed on another semiconductor substrate and exposed irregularly. Then, the aforementioned relative rotation speed was reproduced and a flow of solution was observed. As a result of observation, it was recognized that the solution moved on the surface of the semiconductor substrate at 100 $\mu$m/sec. If the semiconductor substrate was rotated intermittently at 25 rpm like in case of the prior art, the moving speed of the solution was 5 $\mu$m/sec, so that it was recognized that little flow of the solution occurred on the surface of the semiconductor substrate.

Subsequently, after developing for 60 seconds, a supply of nitrogen gas was stopped and the rotation speed of the semiconductor substrate 10 was raised to 500 rpm. Then, pure water was poured from the rinse liquid supply portion so as to rinse the surface of the semiconductor substrate. After rinsing, the supply of pure water was stopped and the semiconductor substrate was rotated at a high speed to blow pure water out of the surface of the semiconductor substrate 10 and dry the surface.

Finally, after stopping the rotation of the semiconductor substrate 10, the semiconductor substrate 10 was carried using a transportation robot and then chemical liquid processing was finished.

The distribution (3$\sigma$ value) of resist pattern dimension in the semiconductor substrate plane with this chemical liquid processing was 4.5 nm with an isolation of 130 nm. As compared to 10 nm, which was observed when no air flow was formed, processing uniformity was improved tremendously.

In the first embodiment of the present invention, the relative rotation speed of the film of the chemical liquid 16 is not restricted to 30 rpm, but may vary in a range of 10 to 60 rpm. More preferably, it is 30 to 40 rpm. Unless the chemical liquid 16 is blown out of the processing object substrate 10, the relative rotation speed may be more than 60 rpm. Further, the processing object substrate 10 does not have to be rotated continuously, but may be rotated by an intermittent turn of 90° every 10 and several seconds.

Further, gas supplied from the gas supply portion 18 is desired to be inactive gas having a low chemical reactivity. For example, it is permissible to use helium, argon or the like as well as nitrogen gas.

Although the first embodiment of the present invention is applied to development process, it can be used in any method of processing (etching) which chemical liquid film is formed by puddling.

Although, in the above embodiment, the circular processing object substrate is employed, for example, a mask substrate for exposure or a rectangular substrate like a liquid crystal substrate can be employed.

Second Embodiment

Next, the chemical liquid processing according to the second embodiment of the present invention is described.

Although air flow is formed above the film of the chemical liquid 16 by supplying gas from the gas supply portion 18 disposed near the outer periphery of the processing object substrate 10 according to the first embodiment of the present invention, in the second embodiment of the present invention, air flow is formed by a rotation of a plate disposed above the film of the chemical liquid 16. Referring FIG. 1, FIG. 9–FIG. 11, the chemical liquid processing method according to the second embodiment of the present invention is explained below.

Figure 9A:
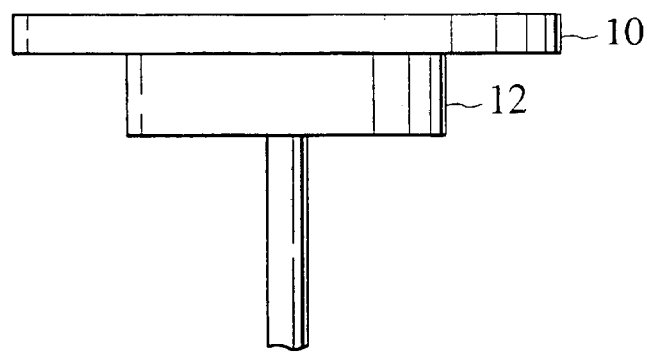
FIG. 9 is a schematic diagram for explaining a chemical liquid film forming step according to the other embodiment of the present invention.

(1) First, as shown in FIG. 9A, the processing object substrate 10 which preparing step is finished is carried to the top of the substrate holding portion 12 by means of a transportation robot (not shown). Then, the processing object substrate 10 is left from the transportation robot and received by the substrate holding portion 12. The processing object substrate 10 is fixed to the substrate holding portion 12 by sucking (S101).

Figure 9B:
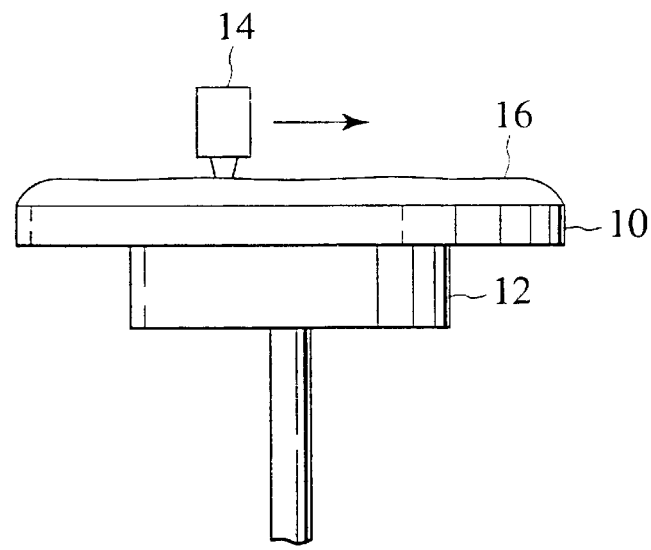

(2) Next, as shown in FIG. 9B, chemical liquid 16 for processing a processing object film on the processing object substrate 10 is formed on the processing object substrate 10. Chemical liquid is supplied from, for example, the chemical spouting nozzle 14 disposed above the processing object substrate 10. The chemical spouting nozzle 14 scans the processing object substrate 10 from an end of the processing object substrate 10 to the other end thereof while supplying the chemical liquid 16. Consequently, the chemical liquid film 16 is formed on the processing object substrate 10 (S102).

Figure 10A:
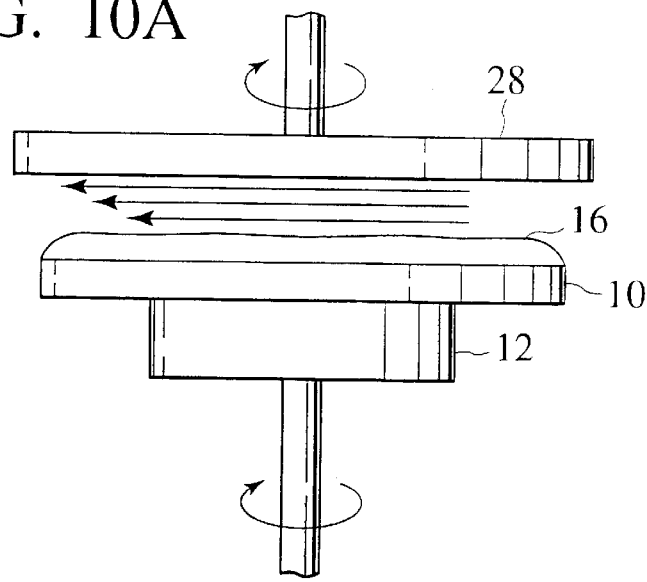
FIG. 10 is a schematic diagram for explaining a chemical liquid film forming step according to the other embodiment of the present invention.

(3) Next, as shown in FIG. 10A, air flow is formed above the film of the chemical liquid 16 on the processing object substrate 10 by rotating a circular plate 28 disposed above the processing object substrate 10. The circular plate 28 is a larger disc than the processing object substrate 10 and disposed near the processing object substrate 10 such that it is not in contact with the surface of the chemical liquid film 16. The central portion of the circular plate 28 is hollow and this section can be opened or closed by a valve (not shown). It is effective to rotate the processing object substrate 10 when the airflow is generated by a rotation of the substrate holding portion 12. In this case, the rotation direction of the processing object substrate 10 is desired to coincide with the direction of air flow (S103).

Figure 10B:
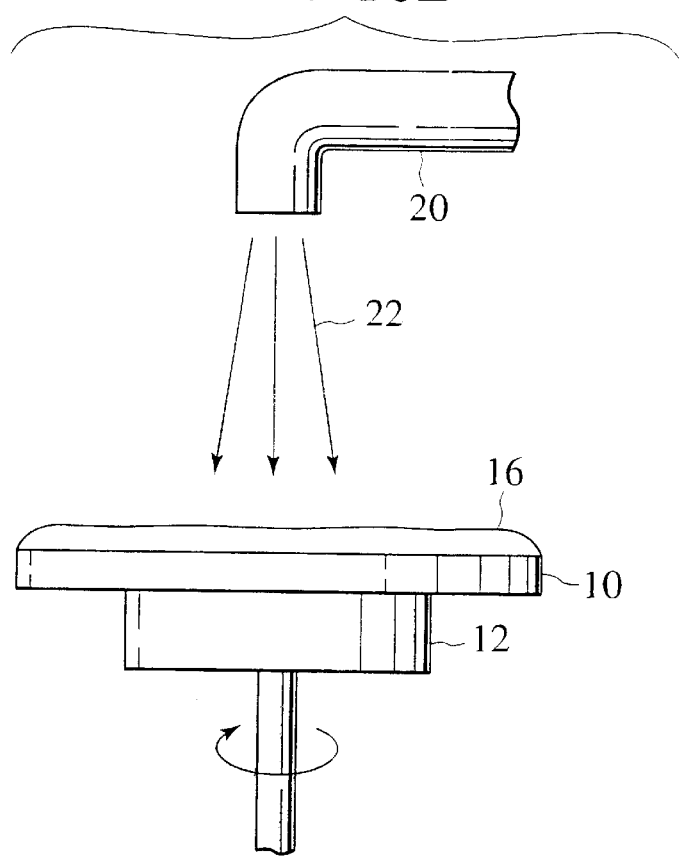

(4) Next, as shown in FIG. 10B, rinse liquid (e.g., pure water) 22 is supplied from the rinse liquid supply port 20 disposed above the processing object substrate 10 and the processing object substrate 10 is cleaned while rotating it (S104).

Figure 11:
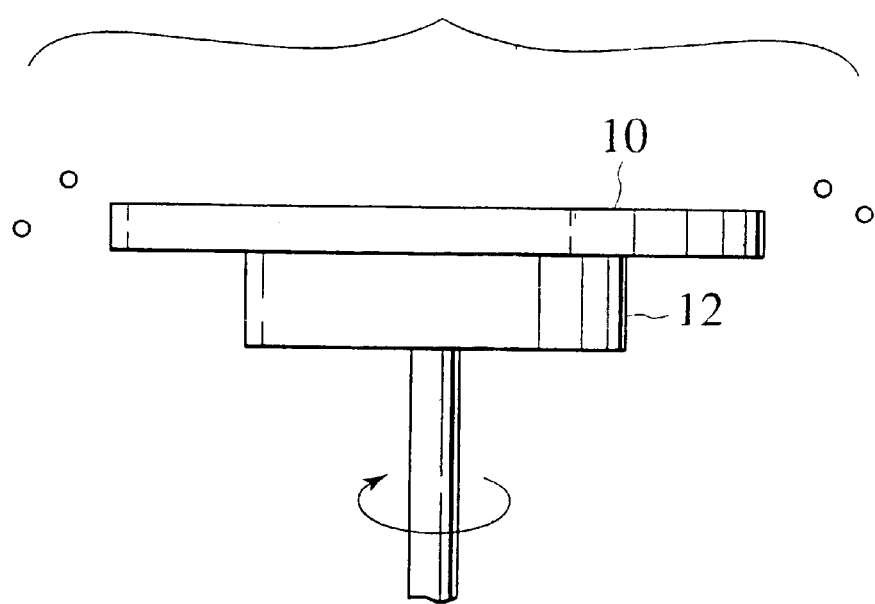
FIG. 11 is a schematic diagram for explaining a chemical liquid film forming step according to the other embodiment of the present invention.

(5) Finally, as shown in FIG. 11, rinse liquid 22 on the substrate is blown out to dry by rotating the substrate at high speeds (S105).

Next, the chemical liquid processing method according to the second embodiment of the present invention is explained with the result of the experiment performed by the inventors.

First, reflection preventing film of 6 nm and resist film of 400 nm were formed successively on a semiconductor substrate 10, which was the processing object substrate. Then, after a latent image was formed on a resist film using an exposure device, baking was carried out at 130° for 60 seconds.

Next, developing solution 16, which was the chemical liquid, was supplied to the top of a semiconductor substrate 10 so as to form film of the developing solution 16 by puddling on the semiconductor substrate. Then, the circular plate 28 is rotated near the processing object substrate 10 such that it is not in contact with the surface of the chemical liquid film 16 (for example, about 15 mm). Then, the rotation speed of the circular plate 28 was adjusted so that the surface rotation speed of the chemical liquid film 16 on the processing object substrate 10 is 40 rpm. Upon this adjustment, the valve of the rotating body 28 was opened. And, the semiconductor substrate 10 is rotated by 10 rpm during the process. At this time, the rotation speed of the circular rotating body 25 was 4,000 rpm.

Subsequently, after developing for 60 seconds, a supply of nitrogen gas was stopped and the rotation speed of the semiconductor substrate 10 was raised to 500 rpm. Then, pure water was poured from the rinse liquid supply portion so as to rinse the surface of the semiconductor substrate 10. After rinsing, the supply of pure water was stopped and the semiconductor substrate 10 was rotated at a high speed to blow pure water out of the surface of the semiconductor substrate 10 and dry the surface.

Finally, after stopping the rotation of the semiconductor substrate, the semiconductor substrate 10 was carried using a transportation robot and then chemical liquid processing was finished.

The distribution (3σ value) of resist pattern dimension in the semiconductor substrate plane with this chemical liquid processing was 4.5 nm with an isolation of 130 nm. As compared to 10 nm, which was observed when no air flow was formed, processing uniformity was improved tremendously.

Figure 12A:
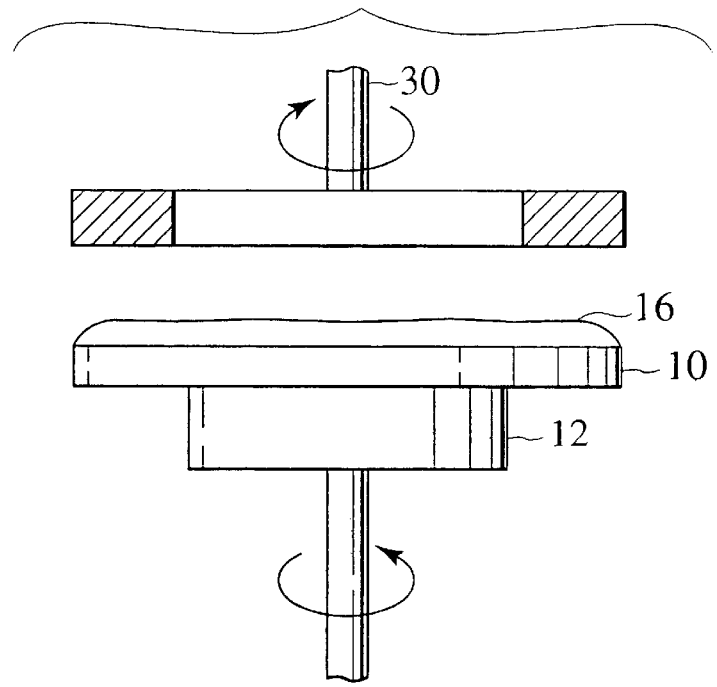
FIG. 12 is a schematic diagram showing a structure of a plate according to the other embodiment of the present invention.
Figure 12B:
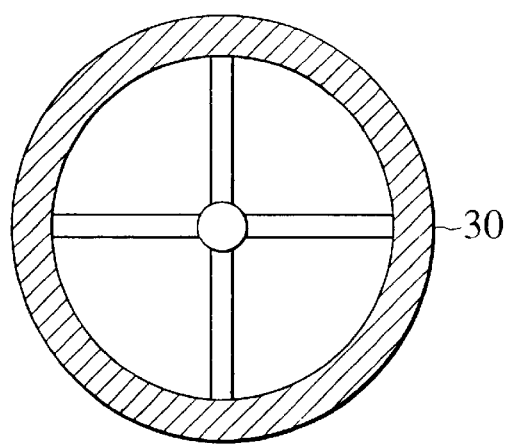
Figure 13A:
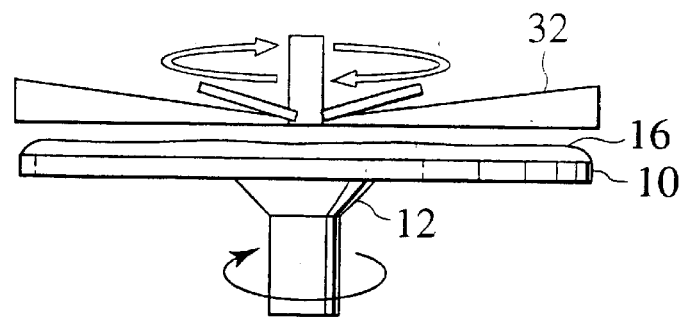
FIG. 13 is a schematic diagram showing a structure of a plate according to the other embodiment of the present invention.
Figure 13B:
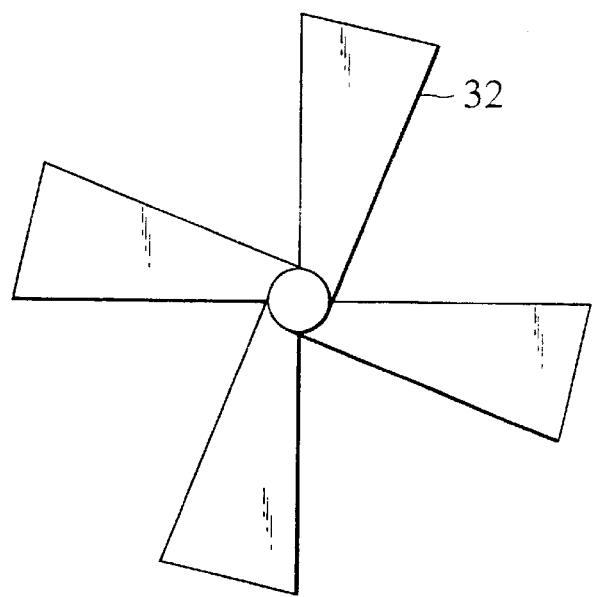

In the second embodiment of the present invention, the circular plate 28 which form air flow over chemical liquid film 16 may be a ring-like rotating plate 30 as shown in FIG. 12. And also, it can be blade-like rotating plate 32 as shown in FIG. 13

In the above mentioned experiment, the relative rotation speed of the developing solution film 16 is not restricted to 40 rpm, but may vary in a range of 10 to 60 rpm. And also, the distance between the plate 28 and the semiconductor surface 10 is not restricted to 15 mm. The distance between each plate 28, 30, 32 and the surface of chemical liquid film 16, and the rotation speed of each plate 28, 30, 32 can be set to any condition, if the predetermined surface rotation speed of developing solution film 16 is obtained and developing solution 16 do not flow out of and to a rear face of the semiconductor substrate 10. More preferably, it is desirable that the distance between each plate 28, 30, 32 and developing solution film 16 is in the range of 10–30 mm and the rotation speed of each plate 28, 30, 32 is around 2000–6000 rpm.

Third Embodiment

Next, the chemical liquid processing according to the third embodiment of the present invention is explained.

Although gas supplied above the film of the chemical liquid 16 by the gas supply portion 18 is restricted to only inactive gas such as nitrogen gas according to the first embodiment, in the third embodiment of the present invention, the other gas such as ozone is added. The third embodiment of the present invention is explained below referring the result of the experiment which the inventors performed.

First, reflection preventing film of 6 nm and resist film of 400 nm were formed successively on a semiconductor substrate 10, which was the processing object substrate. Then, after a latent image was formed on a resist film using an exposure device, baking was carried out at 130° for 60 seconds.

Next, developing solution 16, which was the chemical liquid, was supplied to the top of a semiconductor substrate 10 so as to form film of the developing solution 16 by puddling on the semiconductor substrate 10. Then, nitrogen gas was supplied to the top of the semiconductor substrate 10 so as to form a flow of nitrogen gas such that it contacts the surface of the developing solution 16. The flow rate of the nitrogen gas was adjusted to 150 to 400 mm/sec on the surface of the developing solution film 16 and at the same time, other adjustment was made for the developing solution 16 not to flow out of and to a rear face of the semiconductor substrate 10. Further, the gas supply portion 18 was disposed as shown in FIG. 5D and the flow rate of nitrogen gas was set to be quicker on the outer circle range than the inner circle range. Further, when supplying nitrogen gas, the semiconductor substrate 10 was rotated and the rotation direction was made to coincide with the direction of gas flow. At this time, the rotation speed of the semiconductor substrate 10 was 5 rpm and the surface rotation speed of the developing solution 16 was 35 rpm. That is, the surface rotation speed (relative rotation speed) of the developing solution film 16 relative to the rotation speed of the semiconductor substrate 10 was 30 rpm.

Here, I-beam resist film was formed on another semiconductor substrate and exposed irregularly. Then, the aforementioned relative rotation speed was reproduced and a flow of solution was observed. As a result of observation, it was recognized that the solution moved on the surface of the semiconductor substrate 10 at 100 μm/sec. If the semiconductor substrate was rotated intermittently at 25 rpm like in case of the prior art, the moving speed of the solution was 5 μm/sec, so that it was recognized that little flow of the solution occurred on the surface of the semiconductor substrate 10.

Subsequently, after developing for 40 seconds, ozone of 20 ppm is added to nitrogen gas supplied from the gas supply portion 15 after 40 seconds pass after development is started. By this addition of ozone, solution product generated by development is fragmented. Then, after 20 seconds pass after ozone is added, the supply of nitrogen gas to which ozone is added is stopped and the rotation speed of the semiconductor substrate 10 is increased up to 500 rpm. Then, pure water is poured over the semiconductor substrate 10 and the rising process is performed. After rinsing, the supply of pure water was stopped and the semiconductor substrate 10 was rotated at a high speed to blow pure water out of the surface of the semiconductor substrate 10 and dry the surface.

Finally, after stopping the rotation of the semiconductor substrate 10, the semiconductor substrate 10 was carried using a transportation robot and then chemical liquid processing was finished.

The distribution (3σ value) of resist pattern dimension in the semiconductor substrate plane with this chemical liquid processing was 4.5 nm with an isolation of 130 nm. As compared to 10 nm, which was observed when no air flow was formed, processing uniformity was improved tremendously. Further, the number of the defects is reduced to one tenth of the conventional method.

In the above mentioned experiment, although the concentration of ozone to be added to nitrogen gas is 20 ppm, the present invention is not restricted to this example, but any concentration is permissible as long as it does not generate a large dimensional change or configuration error in processing object film (resist film). The gas to be added may be oxygen, hydrogen or the like as well as ozone.

Liquid Removing (Cleaning/Drying) Process

Next, the liquid removing (cleaning/drying) process according to the embodiment of the present invention is described.

First, the structure of the substrate drying apparatus according to the embodiment of the present invention will be described with reference to FIG. 14.

Figure 14:
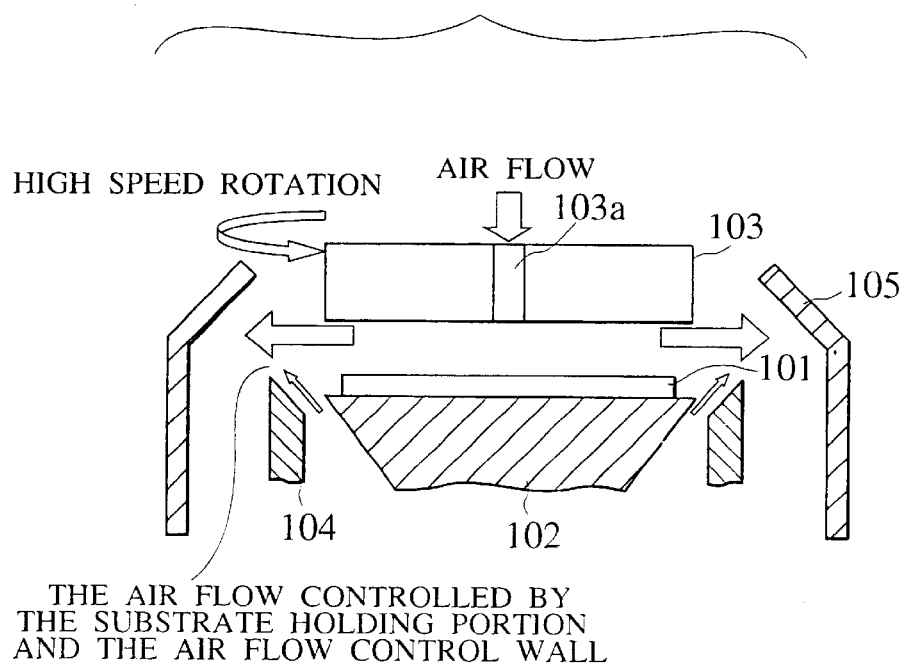
FIG. 14 is a schematic diagram showing a structure of the apparatus which is used in liquid removing step according to the embodiment of the present invention.

As shown in FIG. 14, the substrate drying apparatus of the embodiment of the present invention comprises: a substrate holding portion 102 for holding a processing object substrate 101 on its top face; a plate 103 disposed above the substrate holding portion 102 and made of a flat circular plate of 320 mm in diameter including an air intake hole 103a of 32 mm in diameter in the center thereof; and an air flow control wall 104 provided so as to surround the substrate holding portion 102 for preventing the substrate holding portion 102 from sucking air. Further, according to this embodiment, the substrate holding portion 102, the plate 103 and the air flow control wall 104 are covered with an outer cover 105.

A side face of the substrate holding portion 102 has an invertedly-inclined gradient. A top face of the air flow control wall 104 has a gradient substantially parallel to the gradient of the side face of the substrate holding portion 102. By the rotation of the plate 103, a negative pressure is generated at the space between the processing object substrate 101 and the plate 103. Then, the air flow, which go toward the surface of the substrate from the surrounding atmosphere of the substrate holding portion 102, is generated. The liquid, which is removed from the processing object substrate 101 and diffused in the surrounding atmosphere by the air flow, and dust is sucked and stick to the substrate again. By forming the invertedly-inclined gradient on the side face of the substrate holding portion 102 and providing the air flow control wall 104 surrounding the substrate holding portion 102, the air flow, which goes from the lower part of the substrate holding portion 102 to the above of the substrate holding portion 102, is generated. This air flow kills the air flow which returns from the side wall of the substrate holding portion 102 to the process object substrate and can form the distribution of the air flow which goes from the center of the plate 103 to the outside of the plate 103. Then, the effect of the liquid removing can be enhanced by the air flow which goes from the air intake hole 103a to the outer periphery and, at the same time, it can prevent the influence of the liquid drop or the dust re-adhering.

Fourth Embodiment

Next, chemical liquid processing method according to the fourth embodiment of the present invention using the aforementioned substrate drying processing apparatus is described.

Reflection preventing film and chemically-amplifying resist were applied to the processing object substrate 101 and its surface was exposed to reduced-size projection of a desired pattern through an exposure mask using KrF excimer laser having a wavelength of 248 nm. After heat treatment (PEB) of the substrate was carried out, tetramethyl ammonium hydroxide solution (TMAH; pH13.4) was poured to a processing object substrate in a static condition using a scan nozzle (same as the chemical spouting nozzle 14 which scans the processing object substrate 10 from an end of the processing object substrate 10 to the other end thereof while supplying the chemical liquid 16.) and static developing was carried out for 60 seconds.

Next, pure water was poured as cleaning chemical solution from a nozzle provided at the center of the air intake hole 103a in the plate 103 to the substrate so as to wash solution product generated by developing solution and development. When this cleaning was finished, pure water was swollen in 1 mm to 4 mm high from the processing object substrate.

Figure 15A:
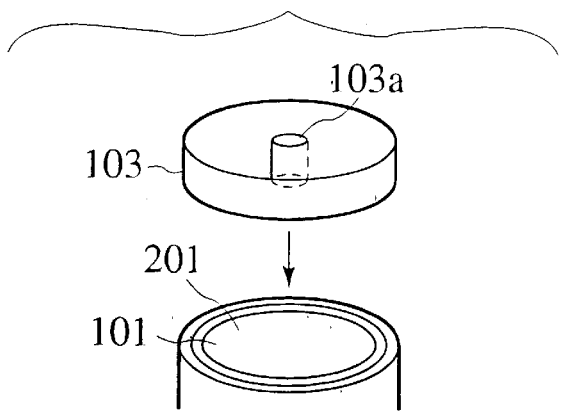
FIG. 15 is a schematic diagram for explaining a liquid removing step according to the embodiment of the present invention.
Figure 15B:
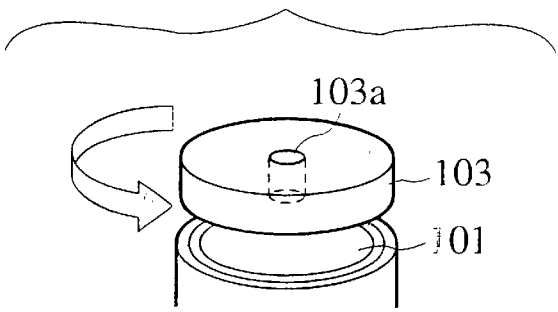
Figure 15C:
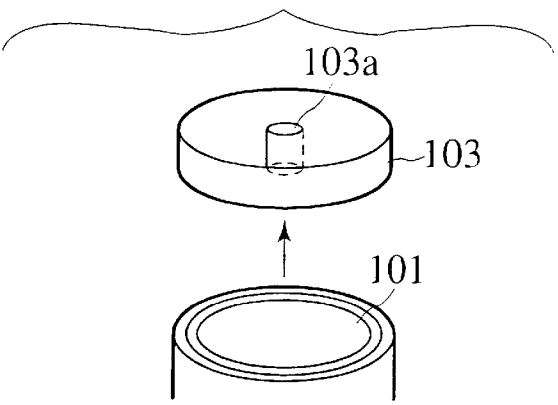

In a conventional drying step, the processing object substrate was rotated at high speeds to blow chemical liquid off the processing object substrate by a centrifugal force to dry the processing object substrate. However, according to fourth embodiment of the present invention, the rear face of the substrate was fixed to the substrate holding portion 101 and made static by means of a vacuum chuck and, just after the processing object substrate is washed, the plate 103 made of alminum having the air intake hole 103a in the center is brought up to a distance (about 4 mm jus the above the substrate) which enables liquid swollen from the processing object substrate 101 and the plate 103 to keep a non-contact as shown in FIG. 15A. Then, as shown in FIG. 15B, the plate 103 was accelerated up to 10,000 rpm in about five seconds and rotated normally at 10,000 rpm for about 10 seconds. After that, a distance between the plate 103 and the processing object substrate 101 was reduced up to 1 mm, which is a minimum distance enabling remaining water droplet and the plate to keep non-contact with each other. Next, the plate was rotated normally at 10,000 rpm for 10 seconds. After the normal rotation was finished, the plate 103 was left from the processing object substrate 101 and then, the drying step was finished (FIG. 15C).

By the above described step, liquid film on the processing object substrate 101 was removed completely, so that the processing object substrate 101 was dried. Further, as compared to the conventional drying method by rotating the substrate at high speeds, fall of resist pattern could be reduced by 20 to 30%. Further, by fixing the processing object substrate 101 by means of a vacuum chuck, generation of dust from the rear face due to abrasion between the substrate and the chuck, which had occurred before, could be prevented.

In the above described liquid removing step, liquid on the processing object substrate was removed using following three operations and effects of the present invention.

Figure 16:
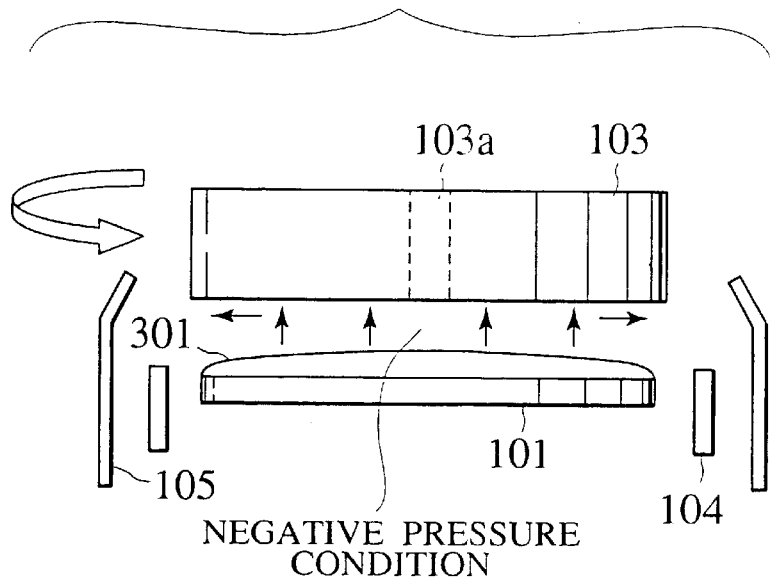
FIG. 16 is a schematic diagram showing a condition of a plate in the initial phase of rotation.

(1) By rotating the plate 103 at high speeds, gas existing between the processing object substrate 101 and the plate 103 flowed out along the plate 103 at the initial phase of rotation as shown in FIG. 16. The amount of air flowing out along the plate 103 becomes larger than the amount of air sucked through the air intake hole 103a in the center of the plate 103, so that a negative pressure is generated between the processing object substrate 101 and the plate 103. This effect is considerable at the initial phase of rotation.

Figure 17:
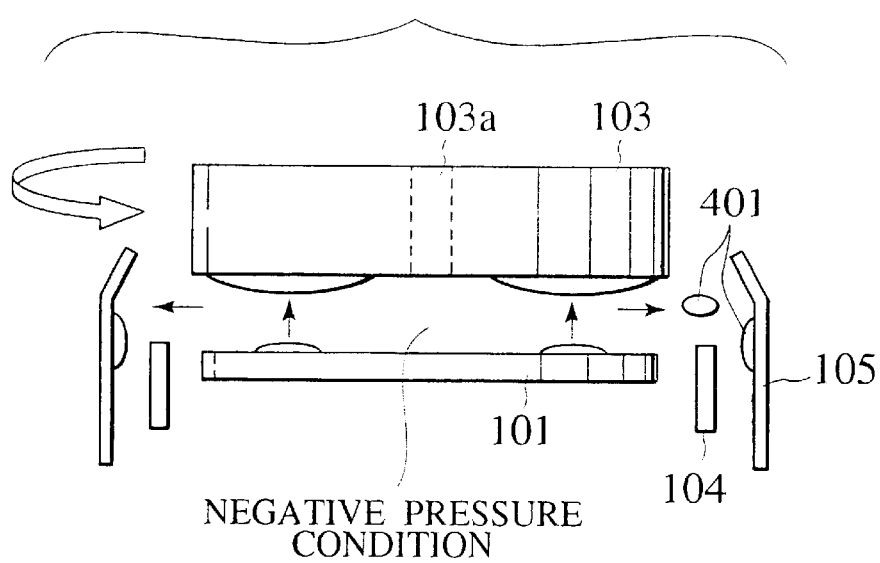
FIG. 17 is a schematic diagram showing a condition of a plate rotating normally.

(2) Because of the aforementioned (1), as shown in FIG. 17, liquid swollen from the processing object substrate is sucked toward the plate 103 disposed above and after that, the liquid is blown off in a direction of tangent line of this rotation along the plate 103. This effect was used mainly when the distance between the substrate and the plate was 4 mm. At this time, although a slight amount of droplets remained on particularly fine resist pattern on the substrate, the other liquid was removed.

Figure 18:
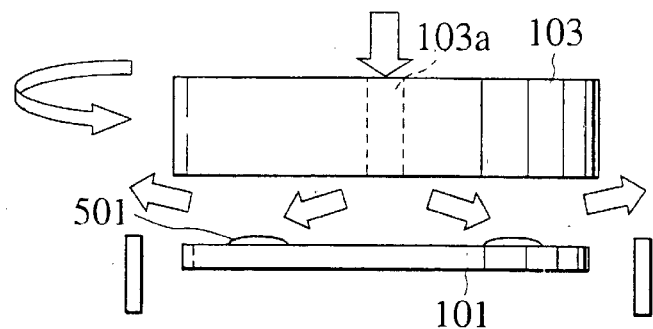
FIG. 18 is a schematic diagram for explaining a condition of gas flow when drying.

(3) If accelerated rotation was changed to normal rotation, as shown in FIG. 18, a sufficient amount of air was sucked through the air intake hole 103a in the center of the plate 103. As a result, with a negative pressure maintained between the processing object substrate 101 and the plate 103, atmospheric pressure was not changed so much. Because of a strong air flow from the center of the processing object substrate 101 to outside, (1) droplets were blown off the substrate and (2) evaporation was accelerated. Mainly this effect was used when the distance between the processing object substrate 101 and the plate 103 was 1 mm. As a result, a slight amount of droplets left on the processing object substrate 101 was removed completely, so that the processing object substrate was dried completely.

Preferably, the negative pressure is controlled depending on the amount of liquid on the processing object substrate 101. The control of the negative pressure is enabled by changing at least one of a rotation speed or acceleration of the plate 103 and the distance between the processing object substrate 101 and the plate 103. Further, the control of the negative pressure is also enabled by changing the diameter of an opening of the air intake hole 12a in the center of the plate 103 during a rotation of the plate 103.

Although various causes for fall of resist pattern can be considered, a main cause for pattern fall in cleaning/drying step is considered to be interfacial tension of cleaning chemical liquid (pure water, etc.) and adhesion between resist and cleaning chemical liquid through interface between them.

A fall of resist pattern according to the conventional drying method will be described with reference to FIG. 19.

Figure 19A:
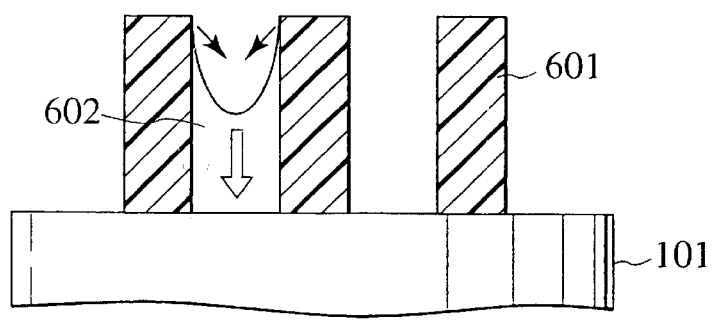
FIG. 19 is a schematic diagram for explaining a fall of resist pattern according to a conventional drying method.
Figure 19B:
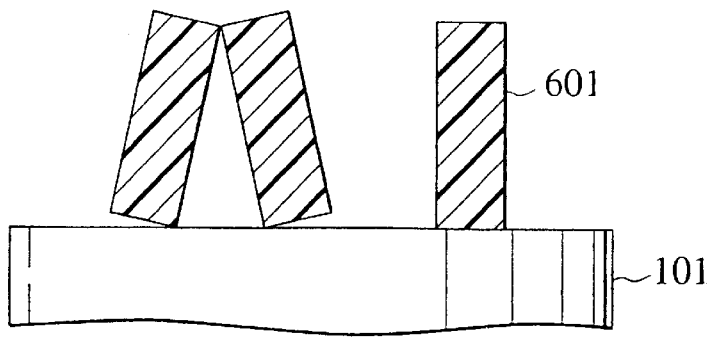

Usually, cleaning liquid between fine patterns of resist adheres up to a higher position than actual water level due to capillary vessel phenomenon by surface tension. According to drying method by high-speed rotation of the substrate in the conventional step, water level of cleaning liquid between resist patterns is decreased by blow-out by a rotation of the processing object substrate 101, so that a force by surface tension is applied to chemical liquid inside two resist patterns (FIG. 19A). This force is transmitted to resist pattern through an interaction between chemical liquid and resist pattern through an interface between them. Thus, pattern fall occurs (FIG. 19B).

According to the conventional liquid removal method, if the substrate was rotated at high speeds, particularly in a fine processing pattern having a high aspect ratio, (1) a centrifugal force is applied to the resist pattern and (2) a centrifugal force applied to liquid on the substrate is felt through interfacial mutual reaction between liquid and resist pattern, so that the resist pattern is likely to fall down.

Figure 20:
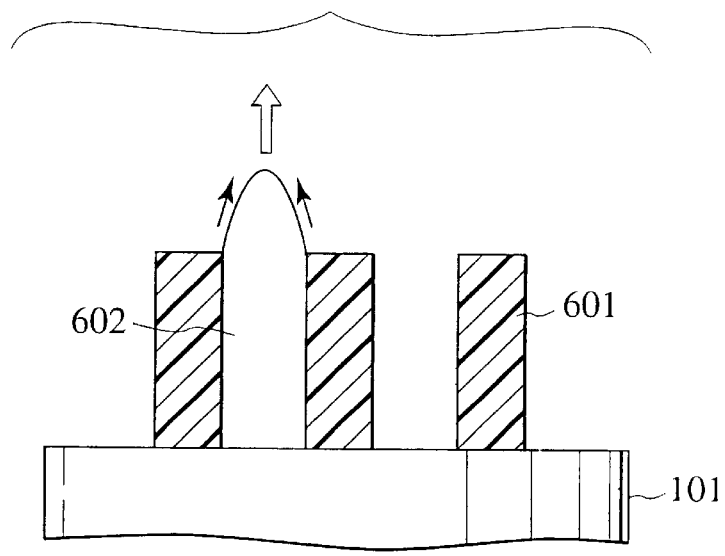
FIG. 20 is a diagram for explaining a force applied to liquid between the resist patterns according to the drying method of the embodiment of the present invention.

On the other hand, according to this embodiment, the processing object substrate 101 was stopped and by rotating the plate 13 above the substrate 101, a pressure on the substrate 101 was turned negative, so that chemical liquid between fine resist patterns was pulled up as shown in FIG. 20. Consequently, liquid was blown out along the plate 103 so as to remove liquid film on the processing object substrate 101.

Thus, a component in the direction of pattern fall of adhering force of liquid interface to the resist pattern is decreased. Further, because the processing object substrate 101 is not rotated but static, no centrifugal force is applied to the substrate and liquid film on the substrate, fall of the resist pattern due to the centrifugal force can be prevented.

Although, according to this embodiment, a flat circular plate ($\phi$320) having an air intake hole ($\phi$32) in the center thereof was used, the dimension of the air intake hole and the shape of the plate are not restricted to particular ones as long as the same operation is ensured. To form a pressure condition and air flow capable of removing liquid film completely, the rotation speed of the plate needs to be 4000 rpm or more and the distance between the substrate and the plate needs to be less than 10 mm. When the plate is rotated, there must be a gap between the plate and liquid. Further, plate rotation time is not restricted to a value of this experiment. Further, although in the aforementioned experiment, the chemically-amplifying resist for KrF excimer laser was used and pure water was used as chemical liquid, the present invention is not restricted to any particular resist type or chemical liquid type.

Fifth Embodiment

Next, chemical liquid processing method according to the fifth embodiment of the present invention using the aforementioned substrate drying processing apparatus is described.

Reflection preventing film and chemically-amplifying resist were applied to the processing object substrate 101 and its surface was exposed to reduced-size projection of a desired pattern through an exposure mask using KrF excimer laser having a wavelength of 248 nm, After heat treatment (PEB) of the substrate was carried out, tetramethyl ammonium hydroxide solution (TMAH; pH13.4) was poured to a processing object substrate in a static condition using a scan nozzle and static developing was carried out for 60 seconds.

Next, pure water was poured as cleaning chemical solution from a nozzle provided in the center of the air intake hole 103a in the plate 103 to the substrate so as to wash solution product generated by developing solution and development. When this cleaning was finished, pure water was swollen in 1 mm to 4 mm high from the processing object substrate.

Figure 21:
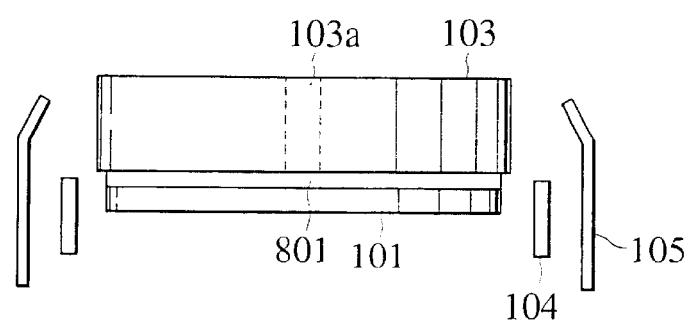
FIG. 21 is a diagram for explaining a force applied to liquid between the resist patterns according to the drying method of other embodiment of the present invention.

In this embodiment, the rear face of the substrate was fixed and made static, the plate was kept static and just after cleaning, the distance between liquid swollen from the substrate and plate was reduced to 1 mm, so that the plate 12 was brought into contact with the liquid film on the plate, thereby removing air layer between the substrate and the plate completely (FIG. 21). Next, the plate was accelerated up to 10,000 rpm in about five seconds and after that, the plate was rotated normally at 10,000 rpm for about 10 seconds.

Through the above described process, liquid on the substrate was blown out so that liquid film was removed completely. Consequently, the substrate was dried. Further, as compared, to the conventional drying method by rotating the substrate at high speeds, fall of the resist pattern could be reduced by 20 to 30%. Further, like the aforementioned embodiment, by fixing the substrate by means of a vacuum chuck so that it is static, generation of dust from the rear face due to abrasion between the substrate and chuck could be prevented.

After bringing the plate into contact with liquid, it is preferable to press the plate against liquid in order to eliminate air layer between the processing object substrate and plate.

In the liquid removing step of this embodiment, the liquid on the substrate was removed using following three operations and effects.

(1) In the initial phase of the rotation of the plate, air intake is not carried out through the air intake hole in the center of the plate because a gap between the plates is filled with liquid. Thus, a gap between the substrate and the plate becomes a considerably negative pressure.
(2) Because of the aforementioned (1), liquid swollen from the substrate is sucked toward the plate disposed above.

After that, the liquid is blown off in the direction of tangent line along the plate. Because the plate is in direct contact with the top of the substrate in this embodiment, this effect is larger than the fourth embodiment, so that the liquid film can be removed effectively.

(3) If the rotation speed turns from acceleration to normal rotation, a sufficient amount of air is sucked through the air intake hole in the center of the plate. Because a negative pressure is kept between the substrate and the plate, atmospheric pressure is not changed so much. (1) Water droplets are blown out of the substrate and (2) evaporation was accelerated by a stong air flow from the center to outside. Consequently, the liquid film on the substrate is removed completely so that the substrate is dried.

At this time, liquid between the resist patterns is sucked upward as shown in the FIG. 20 like the aforementioned embodiment, so that the component acting in the direction of fall is reduced. Further, an influence of the centrifugal force can be eliminated because the substrate is kept static. Because the plate is brought into contact with liquid film in this experiment, the effect of sucking pure water in the aforementioned (2) upward is strong, so that liquid film on the substrate can be removed mostly in the initial phase of accelerated rotation.

Particularly, by carrying out hydrophilic treatment upon the surface of the plate or processing the surface to porous state capable of inducing capillary phenomenon, the effect of sucking the liquid film on the substrate upward between the plate and the liquid film is improved, thereby reducing the component of a force acting for pattern fall. Thus, the pattern fall can be reduced.

Further, by carrying out water repellent treatment upon the surface of the plate, the repulsive force directs toward the outward of the substrate acts on the liquid and the liquid removing step can be performed effectively.

Although according to this embodiment, a flat circular plate ($\phi$320) having an air intake hole ($\phi$30) in the center thereof was used, the dimension of the air intake hole and the shape of the plate are not restricted to particular ones as long as the same operation is ensured. The rotation time is not restricted to an experimental value. The rotation speed of the plate needs to be 4000 rpm or more and the distance between the substrate and the plate needs to be within a distance in which the plate can contact liquid.

Although, in the aforementioned experiment, the chemically-amplifying resist for KrF excimer laser was used and pure water was used as chemical liquid, the present invention is not restricted to any particular resist type or chemical liquid type.

Sixth Embodiment

Finally, the chemical processing method according to the sixth embodiment of the present invention, which is the successive process of the chemical liquid film forming/agitating step and liquid removing step using the plate, is described.

In this sixth embodiment of the present invention, an air flow is formed using a plate disposed above the chemical liquid 16 as same as the aforementioned second embodiment of the present invention, and the liquid on the substrate is removed by the plate disposed above like the aforementioned fourth embodiment of the present invention. The sixth embodiment of the present invention is described below with reference to FIG. 1, FIG. 9–FIG. 10 and FIG. 15.

(1) As shown in FIG. 9A, the processing object substrate 10 which preparing step is finished is carried to the top of the substrate holding portion 12 by means of a transportation, robot (not shown). Then, the processing object substrate 10 is left from the transportation robot and received by the substrate holding portion 12. The processing object substrate 10 is fixed to the substrate holding portion 12 by sucking (S101).

(2) Next, as shown in FIG. 9B, chemical liquid 16 for processing a processing object film on the processing object substrate 10 is formed on the processing object substrate 10. Chemical liquid is supplied from, for example, the chemical spouting nozzle 14 disposed above the processing object substrate 10. The chemical spouting nozzle 14 scans the processing object substrate 10 from an end of the processing object substrate 10 to the other end thereof while supplying the chemical liquid 16. Consequently, the chemical liquid film 16 is formed on the processing object substrate 10 (S102).

(3) Next, as shown in FIG. 10A, air flow is formed above the film of the chemical liquid 16 on the processing object substrate 10 by rotating a circular plate 28 disposed above the processing object substrate 10. The circular plate 28 is a larger disc than the processing object substrate 10 and disposed near the processing object substrate 10 such that it is not in contact with the surface of the film of the chemical liquid 16. The central portion of the circular plate 28 is hollow and this section can be opened or closed by a valve (not shown). Here, the processing object substrate 10 is not rotated and is kept still (In the figure, the substrate is rotated) (S103).

(4) Next, as shown in FIG. 10B, rinse liquid (e.g., pure water) 22 is supplied from the rinse liquid supply port 20 disposed above the processing object substrate 10 and the processing object substrate 10 is cleaned while rotating it (S104).

(5) Finally, as shown in FIG. 15, the circular plate 28(103) disposed above the processing object substrate 10(101) is rotated in high speed with the processing object substrate 10(101) kept still. With this procedure, rinse liquid 22 is blown out from the processing object plate 10(101) and the processing object substrate 10(101) is dried (S105).

As shown in FIG. 14, the apparatus according to the embodiment of the present invention comprises: a substrate holding portion 101 for holding a processing object substrate 102 on its top face; a plate 103 disposed above the substrate holding portion 102 and made of a flat circular plate of 320 mm in diameter including an air intake hole 12a of 32 mm in diameter in the center thereof; and an air flow control wall 104 provided so as to surround the substrate holding portion 102 for preventing the substrate holding portion 102 from sucking air. Further, according to this embodiment, the substrate holding portion 102, the plate 103 and the air flow control wall 104 are covered with an outer cover 105.

A side face of the substrate holding portion 102 has an invertedly-inclined gradient. A top face of the air flow control wall 104 has a gradient subsantially parallel to the gradient of the side face of the substrate holding portion 102. With this structure, the effect of liquid removal process can be enhanced, and, at the same time, it can avoid the liquid droplets and the dust attach to the substrate again.

Next, the chemical liquid processing method according to the sixth embodiment of the present invention is explained, with the result of the experiment performed by the inventors.

First, reflection preventing film of 6 nm and resist film of 400 nm were formed successively on a semiconductor substrate 10, which was the processing object substrate. Then, after a latent image was formed on a resist film using an exposure device, baking was carried out at 130° for 60 seconds.

Next, developing solution 16, which was the chemical liquid, was supplied to the top of a semiconductor substrate 10 so as to form film of the developing solution 16 by puddling on the semiconductor substrate. Then, the circular plate 28 is rotated near the processing object substrate 10 such that it is not in contact with the surface of the film of the chemical liquid 16 (for example, about 15 mm). Then, the rotation speed of the circular plate 28 was adjusted so that the surface rotation speed of the chemical liquid film 16 on the processing object substrate 10 is 40 rpm. Upon this adjustment, the valve of the circular plate 28 was opened. And, the semiconductor substrate 10 is rotated by 10 rpm during the process. At this time, the rotation speed of the circular plate 28 was 4,000 rpm.

Subsequently, after developing for 60 seconds, pure water was poured over the semiconductor substrate 10 and the plate 28 is rotated by 5000 rpm after the plate 28 is moved close to the surface of the semiconductor substrate 10 by 20 mm. By this process, the rinsing process was finished. Upon this process, the valve of the circular plate 28 was opened.

Next, the supply of pure water was stopped and the plate 28 is approached to the rinse liquid poured on the semiconductor substrate 10 such that it is not in contact with the surface of the rinse liquid (for example, about 4 mm). Then, this plate 28 was accelerated up to 10,000 rpm in about five seconds and rotated normally at 10,000 rpm for about 10 seconds. After that, a distance between the plate 28 and the semiconductor substrate 10 was reduced up to 1 mm, which is a minimum distance enabling remaining water droplet and the plate to keep non-contact with each other. Next, the plate 28 was rotated normally at 10,000 rpm for 10 seconds. After the normal rotation was finished, the plate 28 was left from the semiconductor substrate 10 again (FIG. 15C) and the semiconductor substrate 10 was dried.

Finally, after the rotation of the semiconductor substrate 10 was stopped, the semiconductor substrate 10 is moved by transportation robot and the chemical liquid processing is finished.

The distribution (3σ value) of resist pattern dimension in the semiconductor substrate plane with this chemical liquid processing was 4.5 nm with an isolation of 130 nm. As compared to 10 nm, which was observed when no air flow was formed, processing uniformity was improved tremendously, the substrate was dried. Further, as compared to the conventional drying method by rotating the substrate at high speeds, fall of the resist pattern could be reduced by 20 to 30%. Further more, by fixing the substrate by means of a vacuum chuck so that it is static, generation of dust from the rear face due to abrasion between the substrate and chuck could be prevented.

In the sixth embodiment of the present invention, the circular plate 28 which form air flow over chemical liquid film 16 may be a ring-like plate 30 as shown in FIG. 12. And also, it can be blade-like plate 32 as shown in FIG. 13

In the above mentioned experiment, the relative rotation speed of the chemical liquid film 16 is not restricted to 40 rpm, but may vary in a range of 10 to 60 rpm. And also, the distance between the circular plate 28 and the semiconductor surface 10 is not restricted to 15 mm. The distance between each plate 28, 30, 32 and the surface of chemical liquid film 16, and the rotation speed of each plate 28, 30, 32 can be set to any condition, if the predetermined surface rotation speed of chemical liquid film 16 is obtained and chemical liquid film 16 do not flow out of and to a rear face of the semiconductor substrate 10. More preferably, it is desirable that the distance between each plate 28, 30, 32 and chemical liquid film 16 is in the range of 10–30 mm and the rotation speed of each plate 28, 30, 32 is around 2000–6000 rpm.

Further, to form the condition of the pressure and the air flow which can remove the liquid film completely, the rotation speed of the plate needs to be 4000 rpm or more and the distance between the substrate and the plate needs to be within a distance in which the plate can contact liquid. Further, the rotation time is not restricted to an experimental value. And further, the chemically-amplifying resist for KrF excimer laser was used and pure water was used as chemical liquid, the present invention is not restricted to any particular resist type or chemical liquid type.

Other Embodiments

Although the invention achieved by the inventors has been described through the above embodiments, it should not be understood that a description and drawings which are part of this disclosure restrict the present invention. That is, various modified embodiments thereof and operating technologies will be evident to those skilled in the art from this disclosure.

For example, in the chemical liquid processing method according to the first, second and third embodiment of the present invention, it is preferable to reform the surface quality of the processing object substrate 10 before the puddling formation of developing solution 16 on the semiconductor substrate 10 by dropping pure water or diluted developing solution onto the processing object substrate 10. Consequently, the surface of the processing object substrate 10 (resist film surface) is adapted to the developing solution 16, so that puddling formation is facilitated.

Further, in the chemical liquid processing method according to the second embodiment of the present invention, it is desirable to generate a gas flow in a decarbonized environment, which is an environment which does not contain carbon dioxide. Consequently, mixing of $CO_2$ into air flow can be prevented.

As described above, it should be understood that the present invention includes various embodiments not described in this specification. Therefore, the present invention is limited by only specific matters relating to claims of the invention, which are introduced appropriately from the disclosure of the invention.

What is claimed is:

1. A chemical liquid processing method for removing liquid supplied to a substrate, comprising the steps of:
   holding said substrate on a horizontal substrate holding portion;
   rotating a plate having an air intake hole on said substrate;
   generating a negative pressure between the plate and a processing object substrate by rotating said plate; and
   generating air flow between said processing object substrate and said plate by sucking air through said air intake hole in the presence of the negative pressure.

2. The chemical liquid processing method according to claim 1, wherein in the step for generating the negative pressure, said negative pressure is controlled by changing at least one of a rotation speed or acceleration of the plate and a distance between the substrate and the plate.

3. The chemical liquid processing method according to claim 2, wherein the negative pressure is controlled depending on the amount of the chemical liquid on the substrate.

4. The chemical liquid processing method according to claim 1, wherein the diameter of an opening of the air intake hole in the center of the plate is changed during a rotation of the plate.

5. The chemical liquid processing method according to claim 1, wherein the step for rotating the plate is carried out with a gap between the plate and liquid.

6. The chemical liquid processing method according to claim 1, wherein the step for rotating the plate further comprises the steps of:

moving said plate downward from above the substrate so as to bring said plate into a contact with liquid on said substrate; and rotating said plate in a condition that liquid is in contact with said plate.

7. The chemical liquid processing method according to claim 6, wherein in the step for bringing the liquid into contact with the plate, said plate is pressed to said liquid so as to eliminate an air gap between the substrate and said plate.

8. The chemical liquid processing method according to claim 7, wherein a liquid contacting surface of the plate is subjected to hydrophilic treatment or processing to porous state indicating an effect of air suction due to capillary phenomenon.

9. The chemical liquid processing method according to claim 7, wherein a liquid contacting surface of the plate is subjected to water repellent treatment.

10. The chemical liquid processing method according to claim 1, wherein air flow directed from out of the substrate to the center of the substrate is killed by generating air flow directed from below the substrate holding portion to outside above said substrate holding portion on an outer peripheral portion of the substrate.

11. A chemical liquid processing method for processing a substrate using chemical liquid, comprising the steps of:

supplying chemical liquid for processing a processing object film to a processing object substrate on which said processing object film is formed so as to form chemical liquid film on said processing object substrate;

after the step for forming the chemical liquid film, forming air flow, which contacts with the chemical liquid film so as to hold said chemical liquid film on said processing object substrate and form a flow of the chemical liquid on the surface of said chemical liquid film using a plate disposed above said processing object substrate and having an air intake hole with the valve at the center; and removing said chemical liquid supplied to a substrate, wherein the step for removing said chemical liquid supplied to a substrate further comprises the steps of:
generating a negative pressure between the plate and said processing object substrate by rotating said plate; and
generating air flow between said processing object substrate and said plate by sucking air through said air intake hole in the presence of the negative pressure.

* * * * *